United States Patent
Park et al.

(10) Patent No.: US 10,439,080 B2
(45) Date of Patent: Oct. 8, 2019

(54) COMPOSITION FOR FORMING SOLAR CELL ELECTRODE AND ELECTRODE PREPARED USING THE SAME

(71) Applicant: SAMSUNG SDI CO., LTD., Yongin-si, Gyeonggi-do (KR)

(72) Inventors: Sang Hee Park, Suwon-si (KR); Hyun Jin Koo, Suwon-si (KR); Tae Joon Kim, Suwon-si (KR); Min Su Park, Suwon-si (KR); Ji Seon Lee, Suwon-si (KR); Myung Sung Jung, Suwon-si (KR); Hyun Jin Ha, Suwon-si (KR)

(73) Assignee: Samsung SDI Co., Ltd., Yongin-si, Gyeonggi-do (KR)

(*) Notice: Subject to any disclaimer, the term of this patent is extended or adjusted under 35 U.S.C. 154(b) by 0 days.

(21) Appl. No.: 15/654,125

(22) Filed: Jul. 19, 2017

(65) Prior Publication Data

US 2018/0122965 A1 May 3, 2018

(30) Foreign Application Priority Data

Oct. 28, 2016 (KR) .................... 10-2016-0142435

(51) Int. Cl.
*H01L 31/0224* (2006.01)
*C03C 3/12* (2006.01)
(Continued)

(52) U.S. Cl.
CPC ...... *H01L 31/022425* (2013.01); *C03C 3/122* (2013.01); *C03C 4/14* (2013.01);
(Continued)

(58) Field of Classification Search
CPC ........... H01B 1/22; C09D 5/24; B22F 1/0059; H01L 31/0224
(Continued)

(56) References Cited

U.S. PATENT DOCUMENTS 9,039,937 B1* 5/2015 Jung .................. C09D 5/24
252/500
2011/0308595 A1* 12/2011 Carroll ................ B22F 1/0059
136/256
(Continued)

FOREIGN PATENT DOCUMENTS

CN 103915129 A 7/2014
CN 104575661 A 4/2015
(Continued)

OTHER PUBLICATIONS

Taiwanese Office Action dated Mar. 7, 2018 in the corresponding Taiwanese Patent Application No. 106123948.
(Continued)

*Primary Examiner* — Khanh T Nguyen
(74) *Attorney, Agent, or Firm* — Lee & Morse

(57) ABSTRACT

A composition for solar cell electrodes includes silver powder, a glass frit, and an organic vehicle. The glass frit includes a first glass frit and a second glass frit. The first glass frit includes tellurium (Te) and silver (Ag) in a molar ratio (Te:Ag) of about 75:1 to about 1:25. The second glass frit includes a lead-tellurium-oxide (Pb—Te—O)-based glass frit or a bismuth-tellurium-oxide (Bi—Te—O)-based glass frit and is free from silver (Ag).

8 Claims, 1 Drawing Sheet

(51) Int. Cl.
   *C03C 4/14* (2006.01)
   *C03C 8/02* (2006.01)
   *C03C 8/10* (2006.01)
   *C03C 8/16* (2006.01)
   *C03C 8/18* (2006.01)
   *C03C 8/04* (2006.01)
   *C03C 8/08* (2006.01)
   *C03C 8/22* (2006.01)
   *H01B 1/22* (2006.01)
   *H01L 31/0216* (2014.01)

(52) U.S. Cl.
   CPC .................. *C03C 8/02* (2013.01); *C03C 8/04* (2013.01); *C03C 8/08* (2013.01); *C03C 8/10* (2013.01); *C03C 8/16* (2013.01); *C03C 8/18* (2013.01); *C03C 8/22* (2013.01); *H01B 1/22* (2013.01); *C03C 2204/00* (2013.01); *C03C 2205/00* (2013.01); *H01L 31/02168* (2013.01)

(58) Field of Classification Search
   USPC .......................................... 252/514; 136/256
   See application file for complete search history.

(56) References Cited

U.S. PATENT DOCUMENTS

| 2015/0021527 A1* | 1/2015 | Shin | H01B 1/22 |
| | | | 252/514 |
| 2015/0191609 A1* | 7/2015 | Park | H01B 1/22 |
| | | | 252/514 |

FOREIGN PATENT DOCUMENTS

| CN | 104778989 A | 7/2015 |
| CN | 105593946 A | 5/2016 |
| JP | 2012-084585 A | 4/2012 |
| KR | 20150026720 A | 3/2015 |
| KR | 20150054597 A | 5/2015 |
| TW | 201505035 A | 2/2015 |
| TW | 201527244 A | 7/2015 |

OTHER PUBLICATIONS

Korean Office Action dated Oct. 10, 2018.
Chinese Office Action dated Jan. 2, 2019.

* cited by examiner

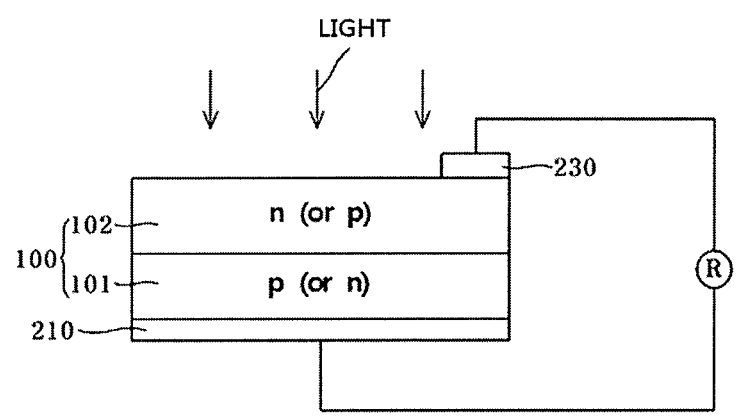

COMPOSITION FOR FORMING SOLAR CELL ELECTRODE AND ELECTRODE PREPARED USING THE SAME

CROSS-REFERENCE TO RELATED APPLICATION

Korean Patent Application No. 10-2016-0142435, filed on Oct. 28, 2016, in the Korean Intellectual Property Office, and entitled: "Composition for Forming Solar Cell Electrode and Electrode Prepared Using the Same," is incorporated by reference herein in its entirety.

BACKGROUND

1. Field

Embodiments relate to a composition for solar cell electrodes and an electrode fabricated using the same.

2. Description of the Related Art

Solar cells generate electricity using the photovoltaic effect of a p-n junction which converts photons of sunlight into electricity. In the solar cell, front and rear electrodes are respectively formed on upper and lower surfaces of a semiconductor wafer or substrate with the p-n junctions therebetween. Then, the photovoltaic effect at the p-n junction is induced by sunlight entering the semiconductor wafer and electrons generated by the photovoltaic effect at the p-n junction provide electric current to the outside through the electrodes. The electrodes of the solar cell are formed on the wafer by applying, patterning, and baking a composition for solar cell electrodes.

SUMMARY

Embodiments are directed to a composition for solar cell electrodes including silver powder, a glass frit, and an organic vehicle. The glass fit includes a first glass fit and a second glass frit. The first glass fit includes tellurium (Te) and silver (Ag) in a molar ratio (Te:Ag) of about 75:1 to about 1:25. The second glass frit includes a lead-tellurium-oxide (Pb—Te—O)-based glass frit or a bismuth-tellurium-oxide (Bi—Te—O)-based glass frit and is free from silver (Ag).

In the glass frit, a weight ratio of the first glass frit to the second glass frit may range from about 7:1 to about 1:5.

Elemental silver (Ag) contained in the first glass frit may be derived from a silver compound having an ionization temperature of about 1,000° C. or less.

Elemental silver (Ag) contained in the first glass frit may be derived from at least one silver compound selected from the group consisting of silver cyanide, silver nitrate, silver halide, silver carbonate, and silver acetate.

The second glass frit may include lead (Pb) and tellurium (Te) in a molar ratio of about 0.01:1 to about 0.5:1.

The second glass frit may include bismuth (Bi) and tellurium (Te) in a molar ratio of about 0.01:1 to about 0.4:1.

The composition for solar cell electrodes may include about 60 wt % to about 95 wt % of the silver powder, about 0.1 wt % to about 20 wt % of the glass frit, and about 1 wt % to about 30 wt % of the organic vehicle.

The composition for solar cell electrodes may further include at least one additive selected from a dispersant, a thixotropic agent, a plasticizer, a viscosity stabilizer, an anti-foaming agent, a pigment, a UV stabilizer, an antioxidant, and a coupling agent.

Embodiments are also directed to a solar cell electrode fabricated using the composition for solar cell electrodes as described above.

BRIEF DESCRIPTION OF THE DRAWING

Features will become apparent to those of skill in the art by describing in detail exemplary embodiments with reference to the attached drawing in which:

The FIGURE illustrates a schematic view of a solar cell according to one embodiment of the present invention.

DETAILED DESCRIPTION

Example embodiments will now be described more fully hereinafter with reference to the accompanying drawing; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing FIGURE, the dimensions of layers and regions may be exaggerated for clarity of illustration.

Hereinafter, embodiments of the present invention will be described in detail.

Herein, the content (mol %) of each elemental metal included in a glass frit may be measured by Inductively Coupled Plasma-Optical Emission Spectrometry (ICP-OES). Since ICP-OES uses a very small sample, sample preparation time can be shortened, errors due to sample pretreatment can be reduced, and analytical sensitivity can be improved.

For example, ICP-OES may include pre-treating a sample, that is, a glass frit, preparing a standard solution, and calculating the content of each elemental metal in the sample by measuring and converting the concentration of an analysis target.

In an operation of pre-treating a sample, a predetermined amount of the sample may be dissolved in an acid solution and then heated for carbonization. Here, the acid solution may include, for example, a sulfuric acid ($H_2SO_4$) solution.

The carbonized sample may be diluted with a solvent such as distilled water or hydrogen peroxide ($H_2O_2$) to an appropriate extent that allows analysis of the analysis target. In view of element detection capability of an ICP-OES tester, the carbonized sample may be diluted about 10,000 fold.

In measurement with the ICP-OES tester, the pre-treated sample may be calibrated using a standard solution, for example, an analysis target standard solution for measuring elements. By way of example, calculation of the mole content of each element in the glass fit can be accomplished by introducing the standard solution into the ICP-OES tester and plotting a calibration curve with an external standard method, followed by measuring and converting the concentration (ppm) of each elemental metal in the pre-treated sample using the ICP-OES tester.

Composition for Solar Cell Electrodes

A composition for solar cell electrodes according to embodiments may include silver powder, a glass frit, and an organic vehicle, wherein the glass frit includes a first glass frit including silver and tellurium in a defined molar ratio and a second glass frit including a lead-tellurium-oxide (Pb—Te—O)-based glass frit or a bismuth-tellurium-oxide (Bi—Te—O)-based glass frit. The first glass fit may include tellurium (Te) and silver (Ag) in a molar ratio (Te:Ag) of about 75:1 to about 1:25, and the second glass fit may include a lead-tellurium-oxide (Pb—Te—O)-based glass frit or a bismuth-tellurium-oxide (Bi—Te—O)-based glass fit and does not contain silver (Ag).

In this regard, it has been found that when the two types of glass frits composed as above were used together in a composition for solar cell electrodes, the composition could improve both adhesion to a substrate and resistance characteristics.

Now, each component of the composition for solar cell electrodes according to the present invention will be described in more detail.

(A) Silver Powder

The composition for solar cell electrodes according to embodiments includes silver (Ag) powder as a conductive powder. The silver powder may have a nanometer or micrometer-scale particle size. For example, the silver powder may have a particle size of dozens to several hundred nanometers, or a particle diameter of several to dozens of micrometers. In some implementations, the silver powder may be a mixture of two or more types of silver powder having different particle sizes.

The silver powder may have a suitable particle shape such as, for example, a spherical, flake or amorphous particle shape.

The silver powder may have an average particle diameter (D50) of, for example, about 0.1 μm to about 10 μm, or, for example, about 0.5 μm to about 5 μm. Within this range of average particle diameter, the composition can reduce contact resistance and line resistance of a solar cell. The average particle diameter may be measured using, for example, a Model 1064D particle size analyzer (CILAS Co., Ltd.) after dispersing the silver powder in isopropyl alcohol (IPA) at 25° C. for 3 minutes via ultrasonication.

The silver powder may be present in an amount of about 60 wt % to about 95 wt % based on the total weight of the composition. Within this range, the composition can improve conversion efficiency of a solar cell and can be easily prepared in paste form. For example, the silver powder may be present in an amount of about 70 wt % to about 90 wt % based on the total weight of the composition.

(B) Glass Frit

The glass frit may serve to form silver crystal grains in an emitter region by etching an anti-reflection layer and melting the silver powder during a baking process of the composition for solar cell electrodes. Further, the glass frit may improve adhesion of the silver powder to a wafer and may be softened to decrease the baking temperature during the baking process.

The composition of the solar cell electrodes according to embodiments includes the first glass frit and the second glass frit, which have different compositions, as the glass frit. For example, the composition of the solar cell electrodes may include the first glass frit including tellurium and silver and the second glass frit free from silver. Next, the first glass frit and the second glass frit will be described in more detail.

(B-1) First Glass Frit

As the first glass frit, a glass frit including tellurium (Te) and silver (Ag) may be used. For example, the first glass frit may include tellurium (Te) and silver (Ag) in a molar ratio (Te:Ag) of 75:1 to 1:25. Within this range, the composition can secure low series resistance and contact resistance without deterioration in adhesion to a substrate.

Elemental silver (Ag) included in the first glass frit may be derived from, for example, a silver compound having an ionization temperature of 1,000° C. or less. For example, the elemental silver (Ag) may be derived from silver cyanide (AgCN), silver nitrate (AgNO$_3$), silver halide (Ag—X), silver carbonate (Ag$_2$CO$_3$), and silver acetate. In the silver halide (Ag—X), X may be iodine, fluorine, chlorine or bromine. For example, X may be iodine.

The first glass frit may further include a metal and/or a metal oxide in addition to tellurium and silver. For example, the first glass frit may further include at least one of zinc (Zn), lead (Pb), bismuth (Bi), phosphorus (P), germanium (Ge), gallium (Ga), cerium (Ce), iron (Fe), lithium (Li), silicon (Si), tungsten (W), magnesium (Mg), cesium (Cs), strontium (Sr), molybdenum (Mo), titanium (Ti), tin (Sn), indium (In), vanadium (V), barium (Ba), nickel (Ni), copper (Cu), sodium (Na), potassium (K), arsenic (As), cobalt (Co), zirconium (Zr), manganese (Mn), aluminum (Al), and oxides thereof.

For example, the first glass frit may be a Te—Ag—Zn—O-based glass frit including tellurium (Te), silver (Ag), and zinc (Zn).

The first glass frit may be prepared from the aforementioned silver compound and metal oxides by a suitable method. For example, the first glass frit may be prepared by mixing the silver compound, tellurium oxide, and optionally, the additional metal oxide using a ball mill or a planetary mill, melting the mixture at about 800° C. to about 1,300° C., and quenching the melted mixture to about 25° C., followed by pulverizing the obtained product using a disk mill, a planetary mill or the like.

(B-2) Second Glass Frit

As the second glass frit, a glass frit including tellurium without silver may be used. For example, the second glass frit may include a lead-tellurium-oxide (Pb—Te—O)-based glass frit or a bismuth-tellurium-oxide (Bi—Te—O)-based glass frit.

The lead-tellurium-oxide (Pb—Te—O)-based glass frit may be derived from metal oxides including lead oxide and tellurium oxide. The term "lead-tellurium-oxide (Pb—Te—O)-based glass frit" refers to a glass frit including at least lead (Pb) and tellurium (Te).

In one embodiment, the lead-tellurium-oxide (Pb—Te—O)-based glass frit may include lead (Pb) and tellurium (Te) in a molar ratio (Pb:Te) of about 0.01:1 to about 0.5:1. Within this range of molar ratio, the composition can be excellent in both adhesion to a substrate and resistance characteristics.

The bismuth-tellurium-oxide (Bi—Te—O)-based glass frit may be derived from metal oxides including bismuth (Bi) oxide and tellurium (Te) oxide. The term "bismuth-tellurium-oxide (Bi—Te—O)-based glass frit" refers to a glass frit including at least bismuth (Bi) and tellurium (Te).

In one embodiment, the bismuth-tellurium-oxide glass frit may include bismuth (Bi) and tellurium (Te) in a molar ratio (Bi:Te) of about 0.01:1 to about 0.4:1. Within this range of molar ratio, the composition can exhibit good properties in terms of both adhesion to a substrate and resistance characteristics.

The lead-tellurium-oxide (Pb—Te—O)-based glass frit and/or the bismuth-tellurium-oxide (Bi—Te—O)-based glass frit may further include a metal and/or a metal oxide in addition to lead, tellurium, and bismuth. For example, the lead-tellurium-oxide (Pb—Te—O)-based glass frit and/or the bismuth-tellurium-oxide (Bi—Te—O)-based glass frit may further include at least one selected from the group consisting of lithium (Li), phosphorus (P), germanium Ge), gallium (Ga), cerium (Ce), iron (Fe), silicon (Si), zinc (Zn), tungsten (W), magnesium (Mg), cesium (Cs), strontium (Sr), molybdenum (Mo), titanium (Ti), tin (Sn), indium (In), vanadium (V), barium (Ba), nickel (Ni), copper (Cu), sodium (Na), potassium (K), arsenic (As), cobalt (Co), zirconium (Zr), manganese (Mn), aluminum (Al), and oxides thereof.

The second glass frit may be prepared by a suitable method. For example, the second glass frit may be prepared by mixing the aforementioned components using a ball mill or a planetary mill, melting the mixture at about 900° C. to about 1,300° C., and quenching the melted mixture to about 25° C., followed by pulverizing the resulting material using a disk mill, a planetary mill or the like.

A weight ratio (first glass frit:second glass frit) of the first glass frit to the second glass frit may range, for example, from about 7:1 to about 1:5. Within this range of weight ratio, the composition can exhibit good properties in terms of both adhesion to a substrate and resistance characteristics. For example, a weight ratio of the first glass frit to the second glass frit may range from about 6:1 to about 1:6.

The first glass frit and/or the second glass frit may have a suitable shape and size. For example, the first glass frit and/or the second glass frit may have an average particle diameter (D50) of about 0.1 µm to about 10 µm and may have various shapes such as a spherical or amorphous shape.

The glass frit including the first glass frit and the second glass frit may be present in an amount of about 0.1 wt % to about 20 wt %, or, for example, about 0.5 wt % to about 10 wt %, based on the total weight of the composition for solar cell electrodes. Within this range, the glass frit can secure stability of a p-n junction under various sheet resistances, minimize serial resistance, and ultimately improve the efficiency of a solar cell.

(C) Organic Vehicle

The organic vehicle may impart suitable viscosity and rheological characteristics for printing to the composition for solar cell electrodes through mechanical mixing with the inorganic component of the composition.

The organic vehicle may be a suitable organic vehicle used in a composition for solar cell electrodes. For example, the organic vehicle may include a binder resin, a solvent, or the like.

The binder resin may be selected from acrylate resins or cellulose resins. For example, ethyl cellulose may be used as the binder resin. In some implementations, the binder resin may be selected from among ethyl hydroxyethyl cellulose, nitrocellulose, blends of ethyl cellulose and phenol resins, alkyd resins, phenol resins, acrylate ester resins, xylene resins, polybutane resins, polyester resins, urea resins, melamine resins, vinyl acetate resins, wood rosin, polymethacrylates of alcohols, or the like.

The solvent may be, for example, hexane, toluene, ethyl cellosolve, cyclohexanone, butyl cellosolve, butyl carbitol (diethylene glycol monobutyl ether), dibutyl carbitol (diethylene glycol dibutyl ether), butyl carbitol acetate (diethylene glycol monobutyl ether acetate), propylene glycol monomethyl ether, hexylene glycol, terpineol, methylethylketone, benzylalcohol, γ-butyrolactone, and ethyl lactate. These may be used alone or as a mixture thereof.

The organic vehicle may be present in an amount of about 1 wt % to about 30 wt % based on the total weight of the composition. Within this range, the organic vehicle can provide sufficient adhesive strength and excellent printability to the composition.

(D) Additives

The composition for solar cell electrodes according to the present invention may further include typical additives to enhance fluidity, process properties and stability, as needed. The additives may include dispersants, thixotropic agents, plasticizers, viscosity stabilizers, anti-foaming agents, pigments, UV stabilizers, antioxidants, coupling agents, and the like. These additives may be used alone or as mixtures thereof. The additives may be present in an amount of about 0.1 wt % to about 5 wt % based on the total weight of the composition for solar cell electrodes, although the content of the additives may be changed, as needed.

Solar Cell Electrode and Solar Cell Including the Same

Embodiments further relate to an electrode formed of the composition for solar cell electrodes and a solar cell including the same. The FIGURE shows a solar cell in accordance with one embodiment of the present invention.

Referring to the FIGURE, a rear electrode 210 and a front electrode 230 may be formed by printing the composition for electrodes on a wafer 100 or substrate including a p-layer (or an n-layer) 101 and an n-layer (or a p-layer) 102 as an emitter, followed by baking. For example, a preliminary process of preparing the rear electrode may be performed by printing the composition on a back surface of the wafer and drying the printed composition at about 200° C. to about 400° C. for about 10 to 60 seconds. Further, a preliminary process for preparing the front electrode may be performed by printing the composition on a front surface of the wafer and drying the printed composition. Then, the front electrode 230 and the rear electrode 210 may be formed by baking the wafer at about 600° C. to about 1,000° C., or, for example, at about 700° C. to about 950° C., for about 30 to 210 seconds.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

EXAMPLES 1 TO 15 AND COMPARATIVE EXAMPLES 1 TO 3

EXAMPLES 1 TO 5

As an organic binder, 1.0 part by weight of ethylcellulose (STD4, Dow Chemical Company) was sufficiently dissolved in 6.8 parts by weight of butyl carbitol at 60° C., and 89.0 parts by weight of spherical silver powder (AG-4-8, Dowa Hightech Co., Ltd.) having an average particle diameter of 1.0 µm, 2.7 parts by weight of glass frits having an average particle diameter of 1.0 µm, 0.2 parts by weight of a dispersant BYK102 (BYK-chemie), and 0.3 parts by weight of a thixotropic agent Thixatrol ST (Elementis Co., Ltd.) were added to the binder solution, followed by mixing and kneading in a 3-roll kneader, thereby preparing a composition for solar cell electrodes. The glass frits included a first glass frit and a second glass frit each prepared according to the composition as listed in Table 1 in amounts as listed in Table 1. The elemental silver of the first glass frit was derived from silver carbonate.

EXAMPLES 6 to 15

A composition for solar cell electrodes was prepared in the same manner as in Examples 1 to 5 except that, as the glass frits, a first glass frit and a second glass frit each prepared according to the composition as listed in Table 2 were used in amounts as listed in Table 2, and the elemental silver of the first glass frit was derived from silver nitrate.

COMPARATIVE EXAMPLES 1 to 3

A composition for solar cell electrodes was prepared in the same manner as in Examples 1 to 5 except that glass frits prepared according to the composition as listed in Table 3 were used.

TABLE 1

| Item | First glass frit (parts by weight) | Second glass frit (parts by weight) Bi—Te—O | Second glass frit (parts by weight) Pb—Te—O | Ag | PbO | Bi$_2$O$_3$ | TeO$_2$ | P$_2$O$_5$ | Li$_2$CO$_3$ | SiO$_2$ | ZnO | WO$_3$ | MgO |
|---|---|---|---|---|---|---|---|---|---|---|---|---|---|
| Example 1 | 2.0 | — | — | 15 | — | 10 | 52 | — | 7 | — | 12 | — | 4 |
|  | — | 0.7 | — | — | — | 9 | 75 | — | 5 | — | 11 | — | — |
| Example 2 | 2.0 | — | — | 18 | — | 8 | 62 | — | 4 | — | 5 | 3 | — |
|  | — | — | 0.7 | — | 19 | — | 58 | 2 | 5 | — | 7 | 3 | 6 |
| Example 3 | 1.5 | — | — | 27 | — | 9 | 49 | — | 7 | 3 | 5 | — | — |
|  | — | 1.2 | — | — | — | 13 | 63 | — | 9 | 2 | 11 | — | 2 |
| Example 4 | 1.5 | — | — | 5 | 29 | — | 61 | — | 2 | — | 3 | — | — |
|  | — | — | 1.2 | — | 21 | — | 45 | 3 | 5 | 1 | 18 | — | 7 |
| Example 5 | 1.0 | — | — | 15 | 35 | — | 45 | — | 2 | 3 | — | — | — |
|  | — | 1.7 | — | — | — | 3 | 85 | — | 7 | — | 5 | — | — |

TABLE 2

| Item | First glass frit (parts by weight) | Second glass frit Bi—Te—O | Second glass frit Pb—Te—O | Ag | PbO | Bi$_2$O$_3$ | TeO$_2$ | P$_2$O$_5$ | Li$_2$CO$_3$ | SiO$_2$ | ZnO | WO$_3$ | MgO | Na$_2$CO$_3$ | Sb$_2$O$_3$ | Cr$_2$O$_3$ |
|---|---|---|---|---|---|---|---|---|---|---|---|---|---|---|---|---|
| Example 6 | 1.0 | — | — | 27 | 15 | 5 | 48 | — | 5 | — | — | — | — | — | — | — |
|  | — | — | 1.7 | — | 12 | — | 77 | — | 9 | — | — | 2 | — | — | — | — |
| Example 7 | 2.0 | — | — | 5 | — | 25 | 61 | — | 4 | 3 | — | — | 2 | — | — | — |
|  | — | 0.7 | — | — | — | 4 | 72 | 2 | 11 | 2 | — | — | 9 | — | — | — |
| Example 8 | 2.0 | — | — | 15 | — | 32 | 48 | — | 2 | 3 | — | — | — | — | — | — |
|  | — | — | 0.7 | — | 21 | — | 59 | — | 5 | — | 12 | — | — | — | — | 3 |
| Example 9 | 1.5 | — | — | 21 | — | 17 | 49 | — | 2 | 8 | — | — | 3 | — | — | — |
|  | — | 1.2 | — | — | — | 16 | 66 | — | 3 | — | 13 | — | — | 2 | — | — |
| Example 10 | 1.5 | — | — | 9 | 34 | — | 42 | — | 7 | — | 5 | — | 3 | — | — | — |
|  | — | — | 1.2 | — | 23 | — | 54 | 2 | — | 11 | — | 3 | 2 | 5 | — | — |
| Example 11 | 1.0 | — | — | 15 | 15 | — | 54 | — | 2 | — | 11 | — | 3 | — | — | — |
|  | — | 1.7 | — | — | — | 16 | 79 | — | 2 | — | — | 3 | — | — | — | — |
| Example 12 | 1.0 | — | — | 21 | 23 | — | 36 | — | 2 | 8 | — | 3 | 7 | — | — | — |
|  | — | — | 1.7 | — | 18 | 2 | 61 | — | 7 | 2 | 8 | — | 2 | — | — | — |
| Example 13 | 0.5 | — | — | 5 | — | 37 | 47 | — | 5 | 3 | — | — | 3 | — | — | — |
|  | — | 2.2 | — | — | — | 5 | 81 | — | 5 | — | 6 | — | — | — | 3 | — |
| Example 14 | 0.5 | — | — | 15 | — | 33 | 42 | — | 2 | 5 | — | — | 3 | — | — | — |
|  | — | — | 2.2 | — | 10 | — | 61 | — | 11 | — | 9 | 2 | 3 | — | 4 | — |
| Example 15 | 2.3 | — | — | 30 | — | 18 | 37 | — | 2 | 8 | — | — | 2 | 3 | — | — |
|  | — | 0.4 | — | — | — | 17 | 69 | — | 3 | — | 6 | — | — | 5 | — | — |

TABLE 3

| Item | First glass frit (parts by weight) | Second glass frit Bi—Te—O | Second glass frit Pb—Te—O | Amount (unit: mol %) Ag | Amount (unit: mol %) PbO | Amount (unit: mol %) $Bi_2O_3$ | Amount (unit: mol %) $TeO_2$ |
|---|---|---|---|---|---|---|---|
| Comp. Example 1 | 2.7 | — | — | 11 | 9 | — | 69 |
| Comp. Example 2 | — | 2.7 | — | — | — | 17 | 73 |
| Comp. Example 3 | — | — | 2.7 | — | 23 | — | 57 |
| Comp. Example 4 | — | 1.4 | — | — | — | 17 | 73 |
|  | — | — | 1.3 | — | 23 | — | 57 |

| Item | $P_2O_5$ | $Li_2CO_3$ | $SiO_2$ | ZnO | $WO_3$ | MgO | $Na_2CO_3$ | $Sb_2O_3$ | $Cr_2O_3$ |
|---|---|---|---|---|---|---|---|---|---|
| Comp. Example 1 | — | 4 | — | 7 | — | — | — | — | — |
| Comp. Example 2 | — | 5 | — | 5 | — | — | — | — | — |
| Comp. Example 3 | — | 6 | — | 7 | — | 2 | — | — | 5 |
| Comp. Example 4 | — | 5 | — | 5 | — | — | — | — | — |
|  | — | 6 | — | 7 | — | 2 | — | — | 5 |

Measurement of Series Resistance, Open-Circuit Voltage, and Efficiency

Each of the compositions for solar cell electrodes prepared in Examples and Comparative Examples was deposited over a front surface of a wafer by screen printing in a predetermined pattern, followed by drying in an IR drying furnace. Then, an aluminum paste was printed on a back surface of the wafer and dried in the same manner as above. A cell formed according to this procedure was subjected to baking at a temperature of 400° C. to 900° C. for 30 to 180 seconds in a belt-type baking furnace, thereby fabricating a solar cell. The solar cell was evaluated as to open-circuit voltage (Voc, mV), series resistance (Rs, mΩ), and conversion efficiency (Eff. %) using a solar cell efficiency tester (CT-801, Pasan Co., Ltd.). Results are shown in Table 4.

TABLE 4

| Item | Voc (mV) | Rs (mΩ) | Eff (%) |
|---|---|---|---|
| Example 1 | 640.22 | 2.96 | 18.16 |
| Example 2 | 639.47 | 3.08 | 18.10 |
| Example 3 | 639.77 | 3.04 | 18.14 |
| Example 4 | 643.14 | 2.62 | 18.20 |
| Example 5 | 638.35 | 3.13 | 18.07 |
| Example 6 | 642.75 | 2.85 | 18.20 |
| Example 7 | 639.39 | 3.09 | 18.09 |
| Example 8 | 641.40 | 2.77 | 18.16 |
| Example 9 | 641.52 | 2.66 | 18.19 |
| Example 10 | 639.78 | 3.02 | 18.15 |
| Example 11 | 642.76 | 2.80 | 18.22 |
| Example 12 | 639.66 | 3.05 | 18.10 |
| Example 13 | 642.44 | 2.67 | 18.18 |
| Example 14 | 642.55 | 2.96 | 18.17 |
| Example 15 | 642.47 | 2.59 | 18.24 |
| Comparative Example 1 | 635.88 | 3.41 | 17.90 |
| Comparative Example 2 | 633.11 | 3.55 | 17.83 |
| Comparative Example 3 | 631.67 | 3.68 | 17.80 |
| Comparative Example 4 | 633.36 | 3.50 | 17.85 |

As shown in Table 4, it may be seen that the solar cell electrodes of Examples 1 to 15 prepared using the first glass frit including tellurium and silver in a molar ratio according to the present embodiments and the second glass frit including a lead-tellurium-oxide (Pb—Te—O)-based glass frit or a bismuth-tellurium-oxide (Bi—Te—O)-based glass frit had relatively low series resistance and provided relatively high conversion efficiency, as compared with the solar cell electrodes of Comparative Examples 1 to 4 not using the first glass frit or the second glass frit according to the embodiments.

By way of summation and review, as a composition for solar cell electrodes, a conductive paste composition including a conductive powder, a glass frit, and an organic vehicle is generally used. The glass frit dissolves an antireflection film formed on a semiconductor wafer such that the conductive powder can be brought into electrical contact with the semiconductor wafer. Generally, as the glass frit, lead-containing glass has been mainly used. The lead-containing glass allows easy control of the softening point and has excellent adhesion to a semiconductor substrate. However, lead-containing glass generally has high contact resistance with the substrate, causing poor solar cell efficiency.

In order to address this issue, compositions for solar cell electrodes using a tellurium-containing glass frit capable of obtaining low contact resistance have recently been proposed. However, such compositions using a tellurium-containing glass frit may have poor adhesion to a semiconductor wafer, causing insufficient durability. Accordingly, methods of adding tungsten to tellurium-containing glass or using a glass frit containing both lead and tellurium have been proposed. However, compositions prepared by these methods may have poor contact resistance characteristics despite having improved adhesion to a substrate. Thus, it is difficult to fabricate a composition for solar cell electrodes that exhibits good properties in terms of both adhesion to a substrate and resistance characteristics, using the aforementioned approaches. Accordingly, a composition for solar cell electrodes that exhibit excellent adhesion to a substrate and resistance characteristics is desirable.

Embodiments provide a composition for solar cell electrodes that has improved contact efficiency with a wafer, thereby minimizing contact resistance and series resistance while exhibiting excellent properties in terms of adhesion to a semiconductor substrate. Embodiments provide a solar cell electrode fabricated using the composition for solar cell electrodes as described herein, the solar cell electrode exhibiting good properties in terms of adhesion to a substrate, fill factor, and conversion efficiency.

Embodiments provide a composition for solar cell electrodes that uses a first glass frit including tellurium and silver in a defined molar ratio and a second glass frit including a lead-tellurium-oxide (Pb—Te—O)-based glass fit or a bismuth-tellurium-oxide (Bi—Te—O)-based glass frit, thereby improving both adhesion to a substrate and resistance characteristics, between which there is generally a trade-off.

Embodiments provide an electrode that is fabricated using the composition for solar cell electrodes according to embodiments and has high adhesion to a substrate and low contact resistance (Rc) and series resistance (Rs), thereby providing excellent fill factor and conversion efficiency.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. A composition for solar cell electrodes, comprising:
    silver powder;
    a glass frit; and
    an organic vehicle,
    wherein:
    the glass frit includes a first glass frit and a second glass frit,
    the first glass frit includes tellurium (Te) and silver (Ag) in a molar ratio (Te:Ag) of about 75:1 to about 1:25, and
    the second glass frit includes a lead-tellurium-oxide (Pb—Te—O)-based glass fit or a bismuth-tellurium-oxide (Bi—Te—O)-based glass fit and is free from silver (Ag), wherein, in the glass frit, a weight ratio of the first glass frit to the second glass frit ranges from about 7:1 to about 1:5.

2. The composition for solar cell electrodes as claimed in claim 1, wherein elemental silver (Ag) contained in the first glass frit is derived from a silver compound having an ionization temperature of about 1,000° C. or less.

3. The composition for solar cell electrodes as claimed in claim 1, wherein elemental silver (Ag) contained in the first glass frit is derived from at least one silver compound selected from the group consisting of silver cyanide, silver nitrate, silver halide, silver carbonate, and silver acetate.

4. The composition for solar cell electrodes as claimed in claim 1, wherein the second glass frit includes lead (Pb) and tellurium (Te) in a molar ratio of about 0.01:1 to about 0.5:1.

5. The composition for solar cell electrodes as claimed in claim 1, wherein the second glass frit includes bismuth (Bi) and tellurium (Te) in a molar ratio of about 0.01:1 to about 0.4:1.

6. The composition for solar cell electrodes as claimed in claim 1, the composition including:
    about 60 wt % to about 95 wt % of the silver powder;
    about 0.1 wt % to about 20 wt % of the glass fit; and
    about 1 wt % to about 30 wt % of the organic vehicle.

7. The composition for solar cell electrodes as claimed in claim 1, further including at least one additive selected from a dispersant, a thixotropic agent, a plasticizer, a viscosity stabilizer, an anti-foaming agent, a pigment, a UV stabilizer, an antioxidant, and a coupling agent.

8. A solar cell electrode fabricated using the composition for solar cell electrodes as claimed in claim 1.

* * * * *